United States Patent [19]

Kuraishi

[11] Patent Number: 4,623,854
[45] Date of Patent: Nov. 18, 1986

[54] SWITCHED CAPACITOR FILTER
[75] Inventor: Yoshiaki Kuraishi, Tokyo, Japan
[73] Assignee: NEC Corporation, Tokyo, Japan
[21] Appl. No.: 703,576
[22] Filed: Feb. 20, 1985
[30] Foreign Application Priority Data
Feb. 20, 1984 [JP] Japan ................................ 59-29739
[51] Int. Cl.[4] ...................... H03H 17/00; H03H 19/00
[52] U.S. Cl. ..................................... 333/173; 333/19;
328/151; 330/9
[58] Field of Search .................. 333/167, 173, 1, 100,
333/19, 20, 172, 174; 330/9, 260; 328/151, 165,
167; 370/29, 53, 58, 112

[56] References Cited
U.S. PATENT DOCUMENTS
4,344,050  8/1982  Callahan ........................ 328/151 X OTHER PUBLICATIONS
Pandel–"Sequential Voltage-Inversion Principle for Switched-Capacitor Filters", Electronics Letters Jun. 21, 1979, vol. 15, No. 13; pp. 399–400.

Primary Examiner—Marvin L. Nussbaum
Attorney, Agent, or Firm—Sughrue, Mion, Zinn, Macpeak and Seas

[57] ABSTRACT

A switched capacitor filter having the same value of capacitance for the integrating capacitor of each filter channel. The use of the same value capacitance results in DC offset voltages for each channel being identical and easy to correct. An input voltage divider network having a separate output tap for each channel causes each channel to have a unique filter transfer function despite the equal value of all integrating capacitors.

6 Claims, 17 Drawing Figures

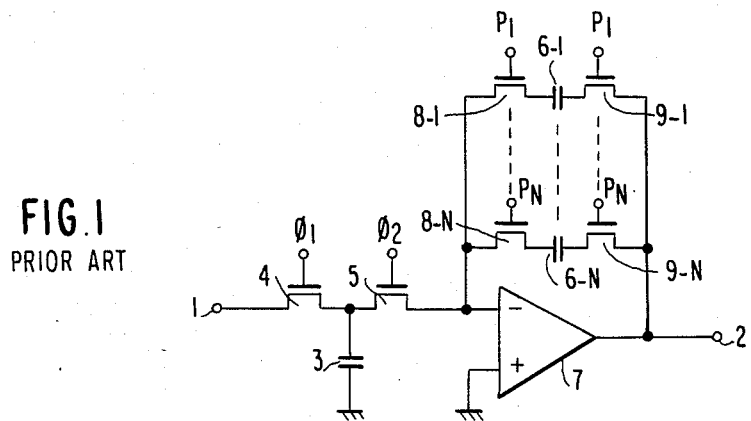
FIG. 1
PRIOR ART

FIG. 4
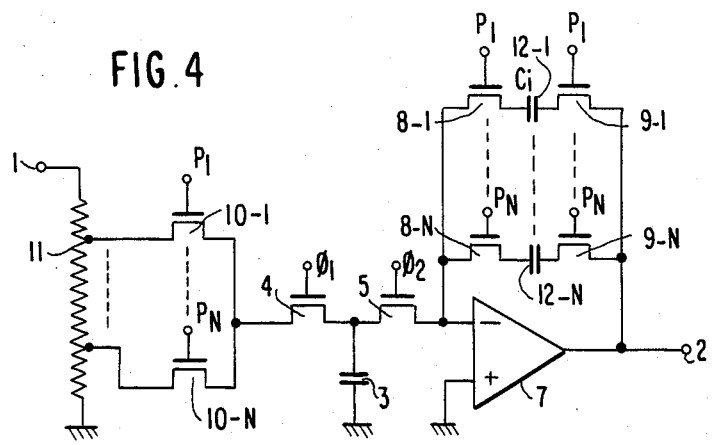

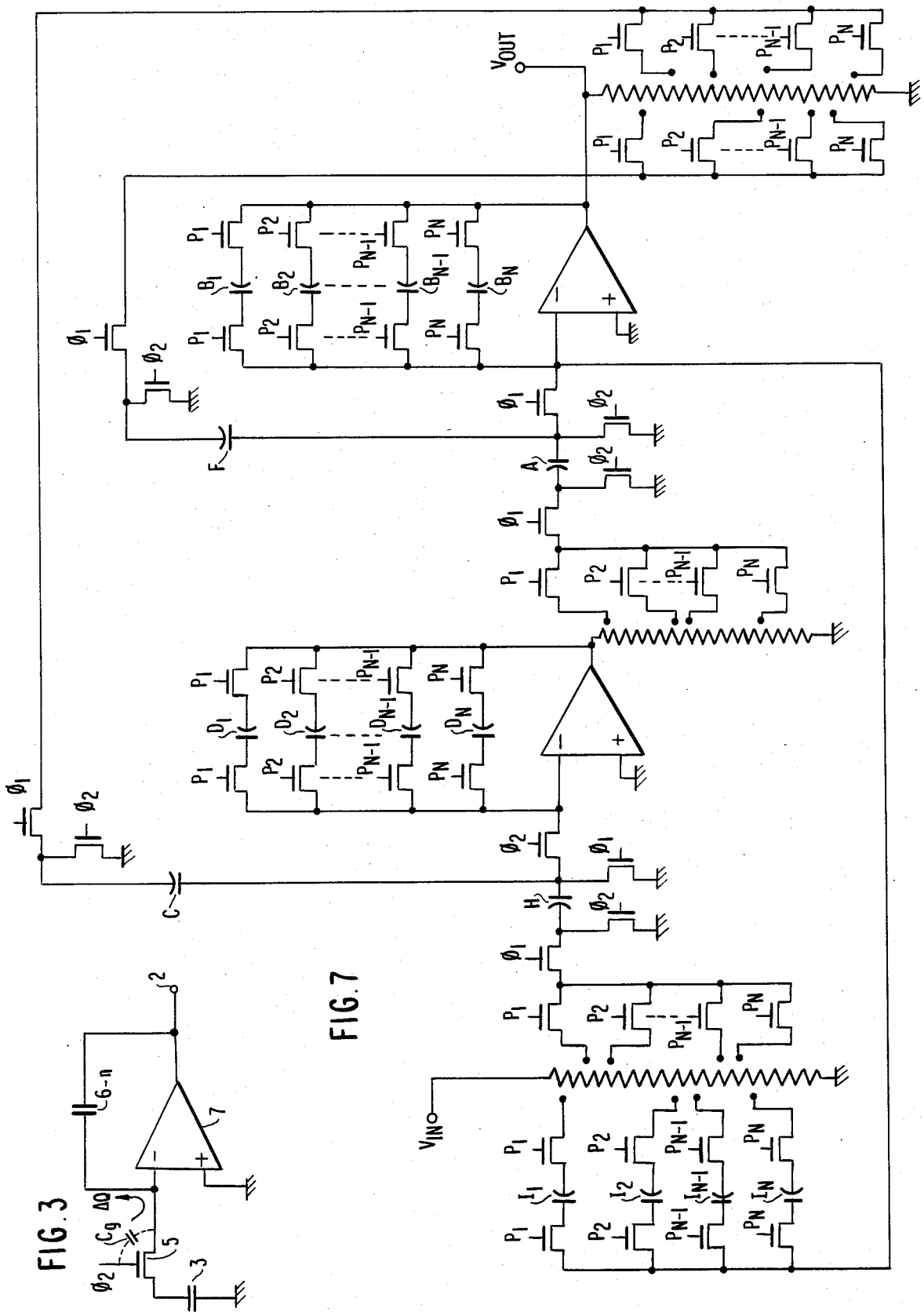

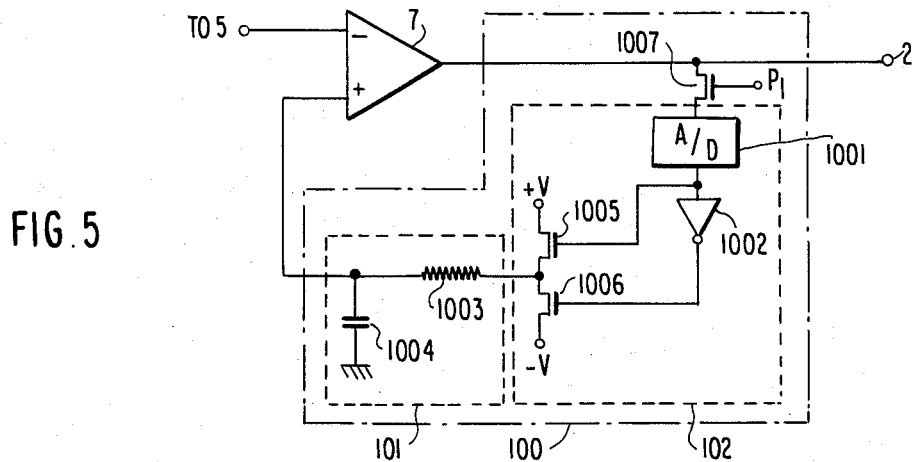
FIG. 5
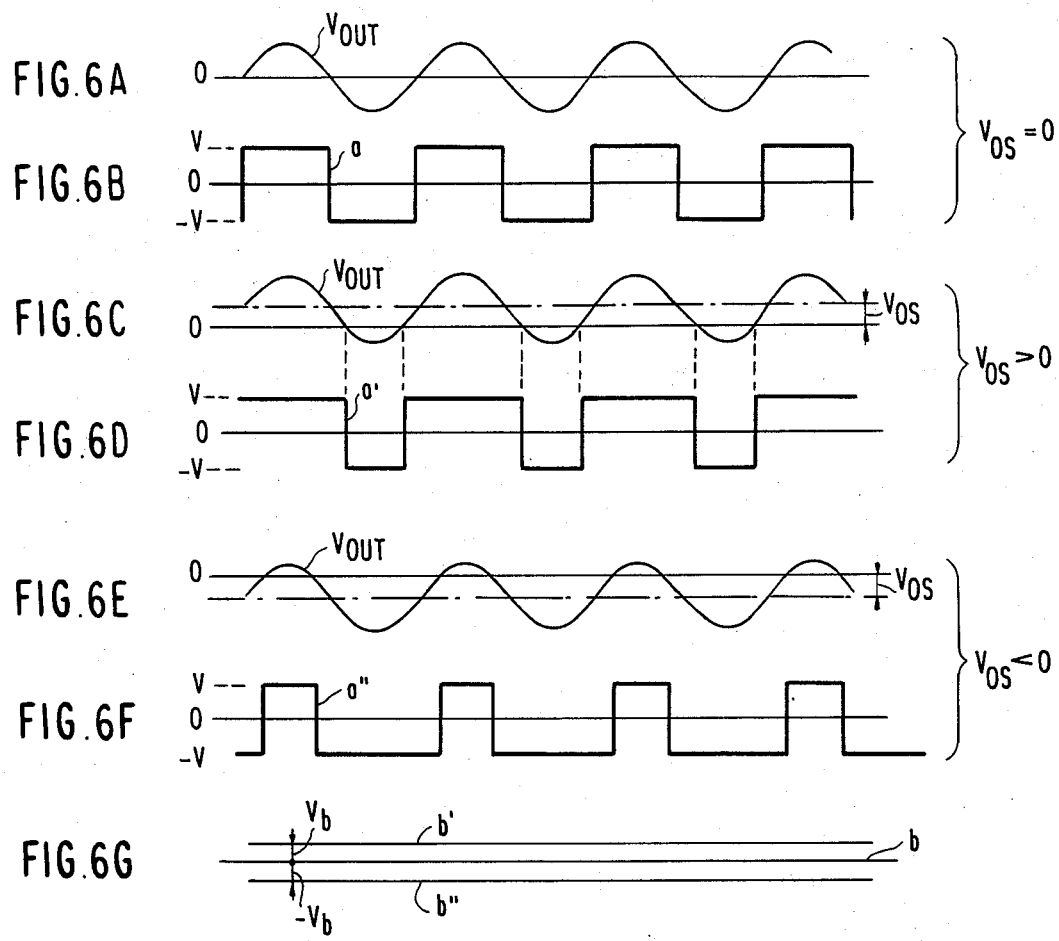

SWITCHED CAPACITOR FILTER

BACKGROUND OF THE INVENTION

The present invention relates to a switched capacitor filter and, more particularly, to a switched capacitor filter for processing a plurality of signals on a time-division basis.

Filters which may be implemented by metal oxide semiconductor (MOS) integrated circuit technologies include a switched capacitor filter (SCF). An SCF comprises at least one operational amplifier (op amp), a plurality of capacitors, and a plurality of switching elements. Due to the SCF's frequency characteristic dependent upon a sampling frequency and a capacitance ratio, the SCF promotes easy production of precision filters without the need for adjustment. Such SCFs include a time-division multiplex switched capacitor filter as disclosed in the paper by Patrick W. Bosshart entitled "A Multiplex Switched Capacitor Filter Bank," IEEE Journal of Solid-State-Circuits, Vol. SC-15, No. 6, December 1980, pp. 939–945. The advantage attainable with the disclosed multiplex SCF is that since a single op amp is shared by a plurality of filters, it cuts down the chip area and power consumption when built in an integrated circuit. However, as will be described later in detail, such a conventional multiplex SCF develops different DC offset voltages in the different channels of incoming time-division multiplex signals. The DC offset voltages introduce errors in the event of rectification of filter outputs or detection of peaks. This requires the SCF to be furnished with offset adjusting circuits in one-to-one correspondence with the respective channels to remove the DC offset voltages, resulting in a complicated circuit arrangement.

SUMMARY OF THE INVENTION

It is, therefore, an object of the present invention to provide a time-division multiplex SCF having a simplified offset voltage adjustment circuit.

A switched capacitor filter of the present invention comprises a resistance dividing means for producing N predetermined voltages by division of resistance in response to a time-division multiplex signal. The time-division multiplex signal is produced by time-division multiplexing N (integer not smaller than 2) signals. A first time-division switching means selects each of the N output voltages of the resistance dividing means on a time-division basis and in synchronism with the time-division multiplex signal. A sampling means samples output signals of the first switching means at a predetermined period. A switched capacitor means is charged with an output signal of the sampling means. The filter also comprises N integrating capacitors equal in capacitance to each other, a single operational amplifier and a second time-division switching means for selectively interconnecting the N integrating capacitors between an output terminal and one input terminal of the operational amplifier on a time-division basis and in synchronism with the input signal.

The above and other objects, features and advantages of the present invention will become more apparent from the following detailed description taken with the accompanying drawings.

BRIEF DESCRIPTION OF THE DRAWINGS

FIG. 1 is a diagram of a conventional SCF;

FIG. 3 is a diagram illustrating a drawback particular to the conventional SCF;

FIG. 4 is a diagram of an SCF embodying the present invention;

FIG. 5 is a schematic circuit diagram of an offset correction circuit that can be used to correct any offset voltage in FIG. 4;

FIGS. 6A–6G are waveform diagrams helpful in explaining the offset correction function; and FIG. 7 is a diagram representative of an application of the present invention.

In the drawings, the same reference numerals designate the same structural elements.

DESCRIPTION OF THE PREFERRED EMBODIMENTS

The description will first be made assuming a case wherein a multiplex signal produced by multiplexing N signals (where N is an integer not smaller than 2) is to be processed according to the time-division principle.

Figure 2A:
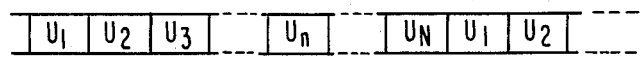
FIGS. 2A–2E are timing charts for demonstrating the operation of the conventional SCF and that of SCF embodying the present invention.
Figure 2B:
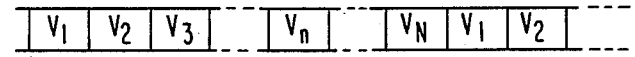
Figure 2C:
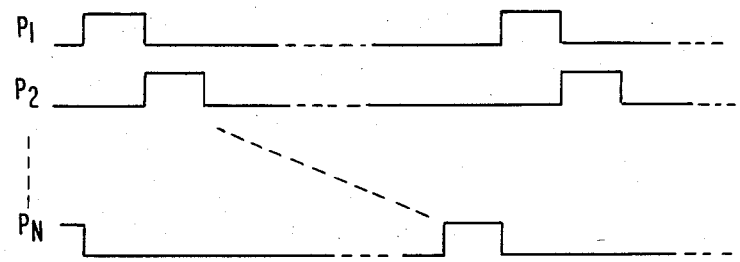
Figure 2D:
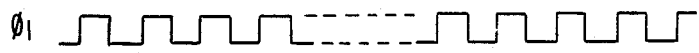
Figure 2E:
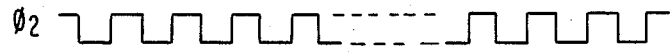

Referring to FIG. 1, a conventional time-division multiplex SCF comprises an input terminal 1, an output terminal 2, a switched capacitor 3, sampling switches 4 and 5, N integrating capacitors 6-1 through 6-N having capacitance values $C_1$ through $C_N$ respectively, an op amp 7, and time-division switches 8-1 through 8-N and 9-1 through 9-N. The sampling switches 4 and 5 operate respectively in response to clock pulses $\phi_1$ and $\phi_2$, each having a predetermined period as shown in FIGS. 2D and 2E, thereby charging the switched capacitor 3 with an input signal voltage Vn (n being an integer which satisfies the relationship $1 \leq n \leq N$). The time-division switches 8-1 through 8-N and 9-1 through 9-N are controlled by the signals $P_1$ through $P_N$, respectively, shown in FIG. 2C. The sampling switches 4 and 5 and the time-division switches 8-1 through 8-N and 9-1 through 9-N may be individually implemented by MOS transistors, in which case each will be turned on when a voltage applied to its gate is at a high level and each will be turned off when a voltage at its gate is at a low level. The N multiplexed signals $v_1$–$v_N$ shown in FIG. 2A, are applied to the input terminal 1 on a time-division basis. When the signal $v_n$ in the n-th channel is applied to the terminal 1, the time-division switches 8-n and 9-n are turned on. By alternate on-off actions of the sampling switches 4 and 5, the input signal v is charged to the switched capacitor 3 during the "on" state of the switch 4 ("off" state of the switch 5) and, then, the charge is transferred to the integrator capacitor 6-n during the "on" state of the switch 5 ("off" state of the switch 4). Time-divided output signals $V_1$–$V_N$ appear at the output terminal 2, as shown in FIG. 2B.

The transfer function of the illustrated SCF is provided as follows. For a signal in the n-th channel, $$\frac{V_n}{v_n} = \frac{-C_s \cdot Z^{-1}}{C_n(1 - Z^{-1})} \qquad \text{Eq. (1)}$$

where $Z = e^{j2\pi f/f_c}$ in which $f_c$ is the frequency of signals $P_1$–$P_N$ adapted to drive the switches 8-1 through 8-N, respectively. The frequency $f_c$ is equal to 1/N of the frequency of the signals $\phi_1$ and $\phi_2$ which drive the sampling switches 4 and 5, respectively. Since the Eq. (1) holds for n=1, 2, ..., N, the illustrated SCF is capable of assigning different transfer functions to the N input signals, $v_1$-$v_N$, if different capacitors 6-n are selected. That is, a single SCF is capable of time-division processing N signals with individual transfer functions.

The reason why the prior art SCF having the above construction allows differences in DC offset voltage to develop between the respective channels, will be described with reference to FIG. 3. FIG. 3 shows an equivalent circuit modeling a condition wherein the sampling pulse $\phi_2$ in the SCF of FIG. 1 is low. Here, assume that the time-division switches 8-n and 9-n have been turned on and the integrator capacitor 6-n has been connected. Usually, a MOS transistor has parasitic capacitances between its gate and its drain and source so that charges leak to the source and drain through the parasitic capacitance upon variation of a gate signal. For this reason, when the sampling pulse $\phi_2$ in FIG. 3 falls to cause transition of the MOS transistor from the on state to the off state, charges are moved from the MOS transistor to the integrator capacitor 6-n by way of a parasitic capacitance Cg. This changes the amount of charge stored in the integrator capacitor 6-n and thereby changes the output voltage, bringing about an offset error. The amount of movement of the charge is a function of a sampling capacitance Cs and an integration capacitance Cn as well known in the art and may be represented by $\Delta Q$ (Cs, Cn). The offset voltage, $\Delta V_n$, may be expressed as:

$$\Delta V_n = \frac{\Delta Q(Cs, Cn)}{Cn} \qquad \text{Eq. (2)}$$

Eq. (2) holds for n=1, 2, ..., N and, since the integration capacitance Cn differs from one channel to another, the offset voltage $\Delta V_n$ also differs from one channel to another. In short, each of the channels in the SCF of FIG. 1 has an offset voltage which differs from those of the others. As a result, the SCF has required separate offset adjusting circuits for each channel.

Referring to FIG. 4, an SCF, according to the present invention is constructed by adding to the SCF of FIG. 1, N time-division switches 10-1 through 10-N controlled by the control signals $P_1$-$P_N$ (see FIG. 2C), respectively, and a resistance divider circuit 11, while replacing the integrator capacitors 6-1 through 6-N (shown in FIG. 1) with integrator capacitors 12-1 through 12-N each having a capacitance value of Ci. The voltages, which the resistance divider 11 produces by dividing a signal voltage coming in through the input terminal 1 by N different ratios, are applied to the switches 10-1 through 10-N, respectively.

If an arrangement is made such that the division ratio $$\left( = \frac{R_n}{R_o} \right):$$

$R_o$ being the total resistance value of the resistance divider 11 and $R_n$, the resistance value between the switch 10-n and ground) of the resistance at the time when the time-division swtich 10-n has been turned on in response to the n-th input signal voltge $v_n$, becomes $$\frac{C_i}{C_n},$$

then the transfer function will be produced by $$\frac{V_n}{v_n} = \frac{-C_i}{C_n} \cdot \frac{CS\,Z^{-1}}{C_i(1-Z^{-1})} = \frac{-C_s \cdot Z^{-1}}{C_n(1-Z^{-1})} \qquad \text{Eq. (3)}$$

which is equal to the function represented by the Eq. (1).

It follows that the SCF of the illustrative embodiment will operate in the same manner as the SCF of FIG. 1 if the division ratio of the resistor divider 11 is adequately selected. At this instant, the offset voltage associated with the output voltage is attained as in the Eq. (2):

$$\Delta V_n = \frac{\Delta Q(Cs, Ci)}{Ci} \qquad \text{Eq. (4)}$$

It will be seen from the above that the offset voltage in each channel in accordance with this particular embodiment is not n-dependent, that is, the offset voltages included in the output voltages in the respective channels can be made equal to each other.

FIG. 5 shows an example of an offset cancellation circuit 100 which is applicable to the embodiment of FIG. 4. The circuit operates based on the sign bit integration principle and consists of a comparator 102, consisting of an analog-to-digital converter 1001, an inverter 1002 and switches 1005–1007, and an integrator 101, consisting of a resistor 1003 and a capacitor 1004. The switch 1007, supplied with any one of the signals $P_1$-$P_N$ (e.g., the signal $P_1$) shown in FIG. 2C, is closed during the logical "1" of the signal $P_1$. Only the sign bit of a plurality of bits produced in the converter 1001 is supplied to the switch 1005 and the inverter 1002, whose output is delivered to the switch 1006. If the potential of the terminal 2 is positive, the sign bit output becomes the logical "1" and the switch 1005 is closed to give the capacitor 1004 the negative voltage-V. On the other hand, if the terminal 2 has a negative potential, the sign bit output becomes the logical "0" to close the switch 1006 so that the capacitor 1004 is given the positive voltage+V. The charge thus developed across the capacitor 1004 is supplied to the positive input terminal of operational amplifier 7 to cancel the offset voltage appearing in a negative input terminal of the amplifier 7.

The comparator 102 produces a constant positive voltage V when an input signal given thereto has a positive voltage. The comparator 102 produces a constant negative voltage-V when the input signal thereto has a negative voltage.

Assuming that an input signal $V_{in}$ involving an offset voltage $V_{os}$ and supplied to the negative terminal of the amplifier 7 shown in FIGS. 4 and 5 is a sinusoidal wave, the offset cancellation operation is carried out as follows:

(i) assume $V_{os}=0$.

In this case, as shown in FIGS. 6A and 6B, the comparator 102 produces a rectangular wave output (a) having the duty ratio of 50%, so that an output (b), shown in FIG. 6G, from the integrator 101 becomes zero. As a result, the input signal $V_{in}$ is not affected by the offset voltage, so no correction is needed.

(ii) Assume $V_{os}>0$.

As shown in FIGS. 6C and 6D, the comparator 102 produces a rectangular wave output (a') having the duty ratio of more than 50%, so that an output (b') from the integrator 101 has a positive voltage $V_b$. The voltage $V_b$ is subtracted in the amplifier 7 from the input signal $V_{in}$ involving the offset voltage $V_{os}$ to reduce the voltage $V_{os}$ by the voltage $V_b$. Such an operation continues until the voltage $V_{os}$ becomes zero.

(iii) Assume $V_{os} < 0$.

As shown in FIGS. 6E and 6F, the comparator 102 produces a rectangular wave output (a') having the duty ratio of less than 50%, so that an output (b") from the integrator 101 has a negative voltage-$V_b$. The voltage-$V_b$ is subtracted in the amplifier 7 from the input signal $V_{in}$ to increase the voltage $V_{os}$ by the Voltage $|-V_b|$. Such an operation continues until the Voltage $V_{os}$ becomes zero.

The offset cancellation can be fully achieved if the above-mentioned cancellation operation is performed for at least one among the N channels shown in FIG. 4. Although the input signal $V_{in}$ was assumed to be a simple sinusoidal wave in the above description, the same cancellation is also achieved when the signal $V_{in}$ is a voice signal. This is because the voice signal is considered to be a combination of a plurality of sinusoidal waves.

FIG. 7 shows a second-order SCF in which two SCFs each having the construction of FIG. 4 are cascaded. For details of a general second-order SCF, reference can be made to a paper by P. E. Fleischer and K. R. Laker entitled "A Family of Active Switched Capacitor Biquad Building Blocks," THE BELL SYSTEM TECHNICAL JOURNAL (December 1979) pp. 2235-2269. The second-order SCF shown in FIG. 7 is achieved by applying this invention to the second-order SCF shown in FIG. 1(a) of the above-mentioned BSTJ. Capacitor A, capacitor array B1-BN (B1=B2=...=BN=BO), capacitor C, capacitor array D1-DN (D1=D2=...=DN=DO), capacitor F, capacitor H and capacitor array I1-IN (I1=I2=...=IN=I0) in FIG. 7 correspond to capacitors A, B, C, D, F, H and I in FIG. 1(a) of the BSTJ, respectively. The capacitors In (n=1, 2, ... N) are connected to positions corresponding to resistance values Rn measured from the ground on a corresponding resistance divider, respectively. The capacitors I, H, A, C and F are selectively connected to positions corresponding to resistance values Rn measured from the ground on a corresponding resistance divider, respectively. Similarly, the capacitors In are connected to positions corresponding to resistance values Rn measured from the ground on a corresponding resistance divider, respectively. The total resistance value of each divider is Ro. Therefore, the transfer function of the SCF in FIG. 7 is represented from the equation (5b) on page 2240 of the above-mentioned BSTJ as follows:

DC offset voltages for each channel and, thereby, simplifies an offset voltage adjusting circuit.

What is claimed:

1. A switched capacitor filter comprising:
   resistance divider means for producing N voltages by division of resistance in response to a time-division multiplex signal which is produced by time-division multiplexing N (integer not smaller than 2) signals;
   first time-division switching means for selecting each of said N voltages of said resistance divider means on a time-division basis and in synchronism with the time-division multiplex signal;
   sampling means for sampling output signals of said first switching means at a predetermined period;
   a switched capacitor to be charged with an output signal of said sampling means;
   N integrating capacitors equal in capacitance to each other;
   a single operational amplifier; and
   second time-division switching means for selectively interconnecting said N integrating capacitors between an output terminal and one input terminal of said operational amplifier on a time-division basis and in synchronism with the operation of said first time-division switching means.

2. A switched capacitor filter as claimed in claim 1, wherein said resistance divider means comprises an input resistance to which said time-division multiplex signal is applied as an input and N taps on said input resistance, said N taps being selected by said first time-division switching means to provide said N output voltages, respectively; the ratio of each tapped portion, Rn, (n=1, 2 ... N) of the total resistance, Ro, to the total resistance being equal to the ratio of the capacitance value, Ci, of each integrating capacitor to a value, Cn (n=1, 2 ... N), where Cn/Cs (Cs being the value of said switched capacitor) is proportional to the transfer function of channel n of the switched capacitor filter.

3. A switched capacitor filter as claimed in claim 2 wherein said first time-division switching means comprises N MOS switching transistors having their respective source-drain paths connected between said N taps, respectively, and a first common terminal.

4. A switched capacitor as claimed in claim 3 wherein said sampling means comprises a MOS transistor having its source-drain path connected between said first common terminal and said switched capacitor and further comprising another MOS transistor having its source-drain path connected between said switched capacitor and said one input terminal of said operating amplifier.

5. A switched capacitor filter as claimed in claim 4 wherein said second time-division switching means comprises;
   MOS switching transistors having their respective source-drain paths connected between said one input terminal of said operational amplifier and said N integrating capacitors, respectively, and further comprising other MOS switching transistors having their respective source-drain paths connected $$\frac{V_n}{v_N} = \frac{D_o a_n I_o - D_o a_n I_o Z^{-1} - AHZ^{-2}}{a_n D_o (F + a_n B_o) + (AC - Fa_n D_o - 2a_n D_o a_n B_o) Z^{-1} + a_n D_o a_n B_o Z^{-2}}$$

$$= \frac{a_n D_o I_o - a_n D_o I_o Z^{-1} - AHZ^{-2}}{a_n D_o (F + a_n B_o) + (AC - a_n F D_o - 2a_n^2 D_o B_o) Z^{-1} + a^2 n D_o B_o Z^{-2}}$$

where each G, J and E in the equation (5b) takes zero, and $a_n$ is equal to Ro/Rn.

The SCF of FIG. 7 allows time-division processing of N input signals $v_1$-$v_N$ to provide transfer functions $V_1/v_1$ to $V_N/v_N$ by applying signals P1 to PN to the switches as shown in FIG. 7 at the timing relationship shown in FIGS. 2A to 2E.

In summary, it will be seen that the present invention provides an SCF which avoids the problem of separate between said N integrating capacitors, respectively, and said output terminal of said operational amplifier.

6. A switched capacitor filter having N channels 1, 2, ... n ... N, each of which has a transfer function proportional to Cn/Cs, where Cn is a value specifying the nth channel and Cs is the same for all channels, comprising;

an operating amplifier, N feedback capacitors Ci for connection between one input terminal and an output terminal of said operating amplifier, Ci being the same value for each channel, switch means for selectively connecting said feedback capacitors Ci between said one input terminal and output terminal of said operational amplifier, an input capacitor Cs connected to the input of said operating amplifier, a voltage divider network having N taps and N switches to connect said taps respectively to said capacitor Cs, said voltage divider network comprising a resistor whose value is set to provide a voltage division ratio of Rn/Ro for each tap n, where n=1, 2, ... n ... N where Rn/Ro=Ci/Cn.

* * * * *